US009012898B2

(12) United States Patent
Kim et al.

(10) Patent No.: US 9,012,898 B2
(45) Date of Patent: Apr. 21, 2015

(54) ELECTROPHORETIC DISPLAY

(71) Applicant: LG Display Co., Ltd., Seoul (KR)

(72) Inventors: Min-Joo Kim, Seoul (KR); Ho-Cheol Kang, Gunpo (KR); Dae-Won Kim, Seoul (KR); Young-Hoon Noh, Daegu (KR); Han-Saem Kang, Suwon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/754,192

(22) Filed: Jan. 30, 2013

(65) Prior Publication Data

US 2013/0141323 A1   Jun. 6, 2013

Related U.S. Application Data

(62) Division of application No. 12/618,405, filed on Nov. 13, 2009, now Pat. No. 8,377,735.

(30) Foreign Application Priority Data

Nov. 25, 2008  (KR) .................. 10-2008-0117731

(51) Int. Cl.
*H01L 35/24* (2006.01)
*H01L 51/00* (2006.01)
(Continued)

(52) U.S. Cl.
CPC ............ *G09G 3/344* (2013.01); *H01L 27/3274* (2013.01); *H01L 29/66757* (2013.01);
(Continued)

(58) Field of Classification Search
CPC ..................... H01L 27/3274; H01L 29/66757; G02F 1/136227
USPC .................. 257/40, 59, 72; 345/107
See application file for complete search history.

(56) References Cited

U.S. PATENT DOCUMENTS 6,608,658 B1   8/2003 Tsujimura et al.
7,344,926 B2 *  3/2008 Yang ............................. 438/149
(Continued)

FOREIGN PATENT DOCUMENTS

CN   1841759 A   10/2006
CN   1917226 A   2/2007
(Continued)

OTHER PUBLICATIONS

Office Action issued in corresponding Korean Patent Application No. 10-2008-0117731, mailed Apr. 11, 2013.
(Continued)

*Primary Examiner* — Howard Weiss
(74) *Attorney, Agent, or Firm* — Brinks Gilson & Lione (57) ABSTRACT

An electrophoretic display device includes: a first substrate having a plurality of pixels formed in a plurality of vertical pixel rows and a plurality of horizontal pixel rows; a plurality of data lines formed at every vertical pixel row of the first substrate; a thin film transistor (TFT) formed at each pixel of the first substrate and including a source electrode, a drain electrode, an organic semiconductor layer, and a gate electrode; a passivation layer formed on the TFTs and the data lines of the first substrate and including a first contact hole exposing the drain electrode of the TFT and a second contact hole exposing the gate electrode of the TFT; a pixel electrode formed on the passivation layer at each pixel of the first substrate and connected with the drain electrode of the TFT via the first contact hole of the passivation layer; a plurality of gate lines formed on the passivation layer at every horizontal pixel row of the first substrate and connected with the gate electrode of the TFT via the second contact hole of the passivation layer; a second substrate attached to the first substrate in a facing manner; a common electrode formed on the second substrate; and an electrophoretic film formed between the first and second substrates.

6 Claims, 7 Drawing Sheets

(51) Int. Cl.
  *G09G 3/34*     (2006.01)
  *H01L 27/32*    (2006.01)
  *H01L 29/66*    (2006.01)
  *G02F 1/167*    (2006.01)
  *G02F 1/1362*   (2006.01)
  *G02F 1/1368*   (2006.01)

(52) U.S. Cl.
  CPC .......... *G02F1/136227* (2013.01); *G02F 1/167* (2013.01); *G02F 2001/136231* (2013.01); *G02F 2001/13685* (2013.01)

(56) References Cited

U.S. PATENT DOCUMENTS

| | | | | |
|---|---|---|---|---|
| 7,471,350 | B2* | 12/2008 | Lee et al. .................. | 349/43 |
| 2004/0257487 | A1 | 12/2004 | Lee et al. | |
| 2005/0139924 | A1 | 6/2005 | Kim et al. | |
| 2005/0156163 | A1 | 7/2005 | Hirai | |
| 2007/0249122 | A1 | 10/2007 | Seo et al. | |
| 2008/0157067 | A1 | 7/2008 | Shiba et al. | |

FOREIGN PATENT DOCUMENTS

| | | |
|---|---|---|
| CN | 101738813 B | 7/2012 |
| KR | 10-2008-0053905 | 6/2008 |
| KR | 1020080053905 A | 6/2008 |

OTHER PUBLICATIONS

Office Action issued in corresponding Korean Patent Application No. 10-2008-0117731, mailed Nov. 8, 2012.

Office Action issued in German Patent Application No. 102009052788.5, mailed Oct. 23, 2014, 13 pages.

* cited by examiner

ELECTROPHORETIC DISPLAY

CROSS-REFERENCE TO RELATED APPLICATIONS

This application is a divisional of U.S. patent application Ser. No. 12/618,405, filed Nov. 13, 2009, now U.S. Pat. No. 8,377,735, which claims priority to Korea Patent Application No. 10-2008-0117731 filed in Korea on Nov. 25, 2008, both of which are hereby incorporated by reference in their entireties.

BACKGROUND

1. Field of the Invention

The present disclosuer relates to an electrophoretic display device and its fabrication method and, more particularly, to an electrophoretic display device capable of minimizing a step at a protection layer and minimizing the number of masks used in a fabrication process.

2. Discussion of the Related Art

In general, an electrophoretic display device is an image displayer using a phenomenon that when a pair of electrodes receiving voltage are put in a colloid solution, colloid particles are moved to one polarity.

The electrophoretic display device is a display device in which a transparent conductive film is coated on a base film which is thin and can be easily bent like paper or plastic to drive electrophoretic suspension and receives much attention as electric paper that may replace the conventional printing mediums such as books, newspapers, and the like.

The general electrophoretic display device will now be described with reference to the accompanying drawings.

Figure 1:
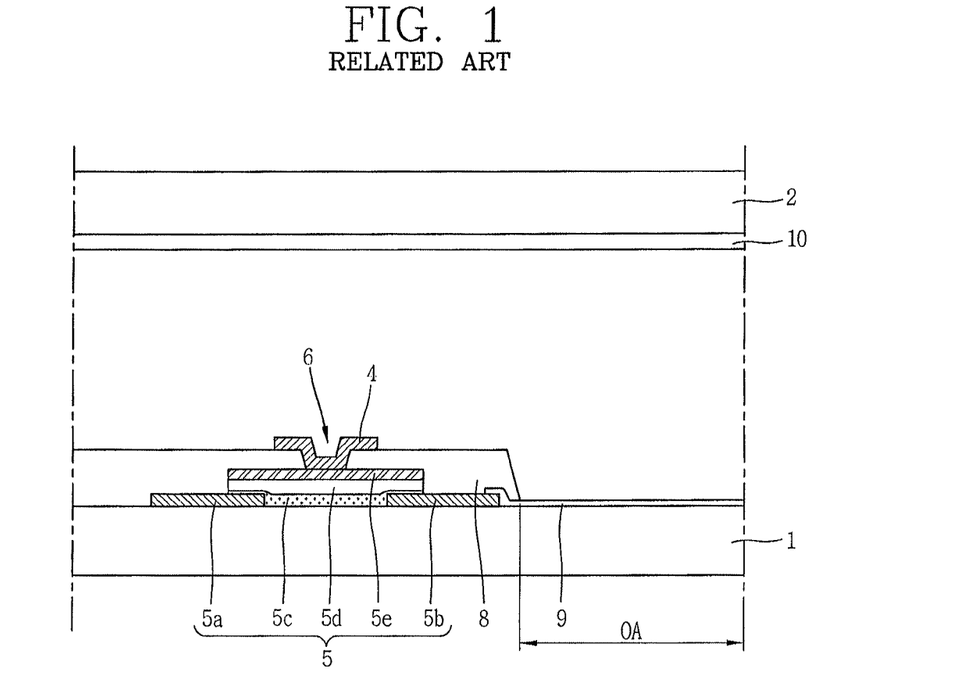
FIG. 1 is a sectional view showing a general electrophoretic display device.

As shown in FIG. 1, an electrophoretic panel provided in the general electrophoretic display device includes a first substrate 1 on which gate lines 4 and data lines (not shown) are formed to cross each other to define a plurality of pixels, and a second substrate 2 disposed to face the first substrate 1.

With reference to FIG. 1, the plurality of pixels defined on the first substrate 1 include a plurality of vertical pixel rows and a plurality of horizontal pixel rows. Data lines are formed on every vertical pixel row on the first substrate 1. A thin film transistor (TFT) 5 including a source electrode 5a, a drain electrode 5b, an organic semiconductor layer 5c, a gate insulating layer 5d, and a gate electrode 5e is formed at each pixel, and a pixel electrode 9 in contact with the drain electrode 5b of the TFT 5 is formed at each pixel.

A passivation layer 8 is formed on the data lines, the TFT 5, and the pixel electrode 9 formed on the first substrate 1. Recently, in order to prevent a pixel voltage applied to the pixel electrode 9 to drive an electrophoretic film from weakening due to the thick passivation layer 5, an open area (OA) is formed at the passivation layer 8 by removing a portion or the entirety of a region overlapping with the pixel electrode 9.

The gate line 4 is formed at every horizontal pixel row on the passivation layer 8 of the first substrate 1 and is in contact with the gate electrode 5e of the TFT 5 via a contact hole 6 provided at the passivation layer 9.

With reference to FIG. 1, a common electrode 10 is formed on the second substrate 101, and the electrophoretic film (not shown) is formed between the first and second substrates 1 and 2.

Although not shown, the electrophoretic film includes a plurality of capsules in which electronic ink including white ink and black ink is distributed, and the white ink and the black ink are charged with each different polarity. Namely, white ink is charged with positive electric charges, and black ink is charged with negative electric charges, or vice versa.

A method for fabricating the general electrophoretic display device having such configuration will be described as follows.

First, a first masking process is performed to form the source electrode 5a, the drain electrode 5b and a data line (not shown) on the first substrate 1 with a plurality of pixels defined thereon.

Next, a second masking process is performed to form the pixel electrode 9 in contact with the drain electrode 5b at each pixel of the first substrate 1.

And then, a third masking process is performed to form the organic semiconductor layer 5c, the gate insulating layer 5d, and the gate electrode 5e at each pixel of the first substrate 1.

Thereafter, the passivation layer 8 is formed on the data line, the TFT 5, and the pixel electrode 9 of the first substrate 1.

Subsequently, a fourth masking process is performed to form the contact hole 6 exposing a portion of the gate electrode 5e at the passivation layer 8, and the open area (OA) is formed to expose a portion or the entirety of the pixel electrode 9.

And then, a fifth masking process is performed to form the gate line 4 on the passivation layer 8. At this time, the gate line 4 is in contact with the gate electrode 5e via the contact hole 6 of the passivation film 8.

In the fabrication method, the first to third masking process includes a step of sequentially forming an element formation material layer (e.g., a pixel electrode formation material layer) and a photosensitive film; a step of forming a photosensitive film pattern by performing photolithography on the photosensitive film; and a step of patterning the element formation material layer by using the photosensitive film pattern.

The related art general electrophoretic display device as described above requires 5 masks in its fabrication process, which, thus, is ineffective in the fabrication costs and time. Thus, an electrophoretic display device having a structure of requiring the minimum number of masks in the fabrication process and its fabrication method are required.

The first substrate 1 and the plurality of elements on the first substrate 1 of the general electrophoretic display device as described above may be applicable to a TFT array substrate of a liquid crystal display (LCD) device. However, when the first substrate 1 and the plurality of elements on the first substrate 1 of the general electrophoretic display device are applied to the TFT array substrate of the LCD device, rubbing of an alignment film is not smoothly made due to a step at the open area (OA) formed at the passivation layer 8 or a region may not be filled with liquid crystal, degrading picture quality.

BRIEF SUMMARY

An electrophoretic display device includes: a first substrate having a plurality of pixels formed in a plurality of vertical pixel rows and a plurality of horizontal pixel rows; a plurality of data lines formed at every vertical pixel row of the first substrate; a thin film transistor (TFT) formed at each pixel of the first substrate and including a source electrode, a drain electrode, an organic semiconductor layer, and a gate electrode; a passivation layer formed on the TFTs and the data lines of the first substrate and including a first contact hole exposing the drain electrode of the TFT and a second contact hole exposing the gate electrode of the TFT; a pixel electrode formed on the passivation layer at each pixel of the first substrate and connected with the drain electrode of the TFT via the first contact hole of the passivation layer; a plurality of gate lines formed on the passivation layer at every horizontal pixel row of the first substrate and connected with the gate electrode of the TFT via the second contact hole of the passivation layer; a second substrate attached to the first substrate in a facing manner; a common electrode formed on the second substrate; and an electrophoretic film formed between the first and second substrates.

A method for fabricating an electrophoretic display device includes: preparing a first substrate on which a plurality of pixels are defined and formed in a plurality of horizontal pixel rows and a plurality of vertical pixel rows; forming a data line at every vertical pixel row on the first substrate and forming source and drain electrodes at every pixel on the first substrate; forming an organic semiconductor layer, a gate insulating layer, and a gate electrode at each pixel on the first substrate to form a TFT; forming a passivation layer on the data line and on the TFT of the first substrate; forming a first contact hole exposing the drain electrode of the TFT and a second contact hole exposing the gate electrode of the TFT at the passivation layer; and forming a pixel electrode on the passivation at every pixel, the pixel electrode being connected with the drain electrode of the TFT via the first contact hole, and forming a gate line on the passivation layer at every vertical pixel row, the gate line being connected with the gate electrode of the TFT via the second contact hole.

The foregoing and other objects, features, aspects and advantages of the present invention will become more apparent from the following detailed description of the present invention when taken in conjunction with the accompanying drawings.

DETAILED DESCRIPTION OF THE DRAWINGS AND THE PRESENTLY PREFERRED EMBODIMENTS

An electrophoretic display device and its fabrication method according to exemplary embodiments of the present invention will now be described in detail with reference to the accompanying drawings.

First, the configuration of the electrophoretic display device according to an embodiment of the present invention will now be described with reference to FIGS. 2 and 3.

Figure 2:
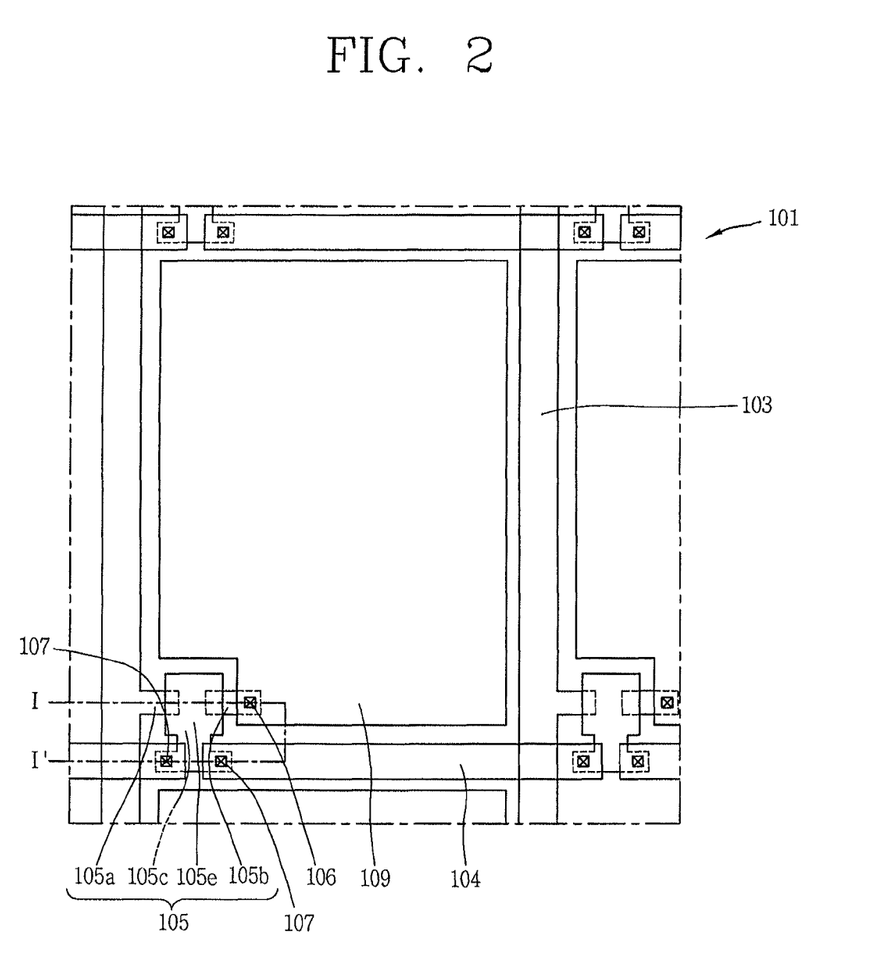
FIG. 2 is a plan view showing an electrophoretic display device according to an exemplary embodiment of the present invention.
Figure 3:
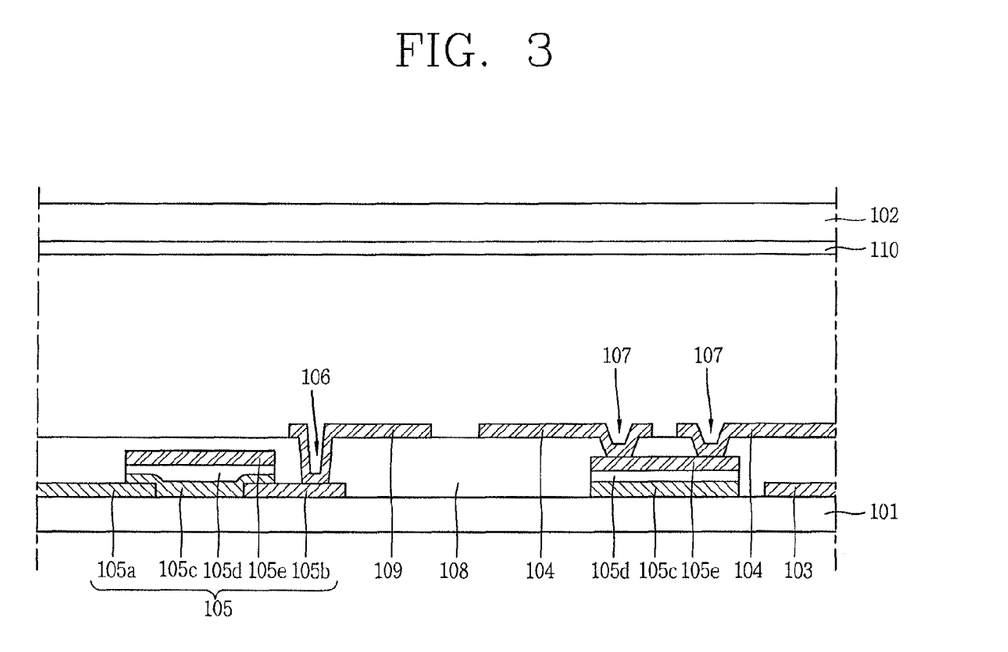
FIG. 3 is a sectional view taken along line I-I' of FIG. 2, showing first and second substrates.

As shown in FIGS. 2 and 3, the electrophoretic display device according to an embodiment of the present invention includes: a first substrate 101 having a plurality of pixels formed in a plurality of vertical pixel rows and a plurality of horizontal pixel rows; a plurality of data lines 103 formed at every vertical pixel row of the first substrate 101; a thin film transistor (TFT) 105 formed at each pixel of the first substrate 101 and including a source electrode 105a, a drain electrode 105b, an organic semiconductor layer 105c, and a gate electrode 105e; a passivation layer 108 formed on the TFTs 105 and the data lines 103 of the first substrate 101 and including a first contact hole 106 exposing the drain electrode 105b of the TFT 105 and a second contact hole 107 exposing the gate electrode 105e of the TFT 105; a pixel electrode 109 formed on the passivation layer 108 at each pixel of the first substrate 101 and connected with the drain electrode 105b of the TFT 105 via the first contact hole 106 of the passivation layer 108; a plurality of gate lines 104 formed on the passivation layer 108 at every horizontal pixel row of the first substrate 101 and connected with the gate electrode 105e of the TFT 105 via the second contact hole 107 of the passivation layer 108; a second substrate 102 attached to the first substrate 101 in a facing manner; a common electrode 110 formed on the second substrate 102; and an electrophoretic film (not shown) formed between the first and second substrates 101 and 102.

The elements of the electrophoretic display device according to an embodiment of the present invention will now be described in detail.

The electrophoretic display device according to an embodiment of the present invention includes an electrophoretic panel including a first substrate 101, an upper substrate, and a second substrate 102, a lower substrate, and an electrophoretic film (not shown) is formed between the first and second substrates 102.

Although not shown, the electrophoretic film includes a plurality of capsules including electronic ink of white and black ink distributed therein, and the white ink and the black ink are charged with mutually different polarities. Namely, the white ink is charged with positive charges and the black ink is charged with negative charges, or vice versa.

With reference to FIG. 2, a plurality of pixels are defined on the first substrate 101, and the plurality of pixels form a plurality of vertical pixel rows and a plurality of horizontal pixel rows.

On the first substrate 101, a data line 103 is formed at every vertical pixel row, and a gate line 104 is formed at every horizontal pixel row. A thin film transistor (TFT) 105 is formed at each crossing of the gate line 103 and the data line 104.

With reference to FIGS. 2 and 3, the TFT 105 includes a source electrode 105a and a drain electrode 105b formed on the first substrate 101, an organic semiconductor layer 105c formed on the source electrode 105a and the drain electrode 105b, a gate insulating layer 105d formed on the organic semiconductor layer 105c, and a gate electrode 105e on the gate insulating layer 105d. The organic semiconductor layer 105c, the gate insulating layer 105d, and the gate electrode 105e of the TFT 105 are formed to have the same area and have the same overlap area. Namely, the organic semiconductor layer 105c, the gate insulating layer 105d, and the gate electrode 105e of the TFT 105 are formed through a single masking process, details of which will be described in explaining a method for fabricating the electrophoretic display device.

The gate electrode 105e of the TFT 105 is connected to the gate line 104, the source electrode 105e is connected to the data line 103, and the drain electrode 105b is connected to the pixel electrode 109.

The organic semiconductor layer 105c of the TFT 105 is made of pentacene or polythiopene.

With reference to FIG. 3, the passivation layer 108 is formed on the data line 103 and the TFT 105 of the first substrate 101. A first contact hole 106 exposing the drain electrode 105b of the TFT 105 is formed at the passivation layer 108, and a second contact hole 107 exposing the gate electrode 105e of the TFT 105 is formed at the passivation layer 108.

With reference to FIG. 3, the pixel electrode 109 is formed at each pixel on the passivation layer 108. The pixel electrode 109 is connected to the drain electrode 105b of the TFT 105 in a corresponding pixel via the first contact hole 106 of the passivation layer 108.

The gate line 104 is also formed on the passivation layer 108. The gate line 104 is connected to the gate electrode 105e of the TFT 105 via the second contact hole 107, and made of the same material on the same layer as the pixel electrode 109.

The gate line 104 and the pixel electrode 109 are made of a transparent conductive material such as indium tin oxide (ITO) or an opaque metal such as molybdenum (Mo), aluminum (Al), chromium (Cr), copper (Cu), and the like.

With reference to FIGS. 2 and 3, two second contact holes 107 are formed at each pixel on the passivation layer 108, and each gate line 104 is separately formed at a plurality of regions. The plurality of regions forming the gate line 104 are electrically connected via the second contact hole 107 and the gate electrode 105e of the TFT 105. Namely, the gate line 104 is patterned to form the plurality of regions, but they are electrically connected via the second contact hole 107 and the gate electrode 105e of the TFT 105.

In FIGS. 2 and 3, two second contact holes 107 are shown to be formed, but the present invention is not limited thereto and three or more second contact holes 107 may be formed as necessary within the scope of the present invention.

Also, in FIGS. 2 and 3, the gate lines 104 are separately formed at a plurality of regions and the plurality of regions constituting the gate lines 104 are electrically connected to each other via the second contact hole 107 and the gate electrode 105e of the TFT 105, but the present invention is not limited thereto and one gate line 104 may be formed without being separated into the plurality of regions and one second contact hole 107 may be formed within the scope of the present invention.

With reference to FIG. 3, the common electrode 110 is formed on the second substrate 102, and a common voltage is supplied to the common electrode 110.

When white ink in the capsules forming the electrophoretic film (not shown) formed between the first and second substrates 101 and 102 is charged with positive charges and black ink is charged with negative charges, a pixel voltage of a negative potential is applied to the pixel electrode 109 and a common voltage of a positive potential is applied to the common electrode 110. Then, the white ink of positive charges moves toward the pixel electrode 109 and the black ink of negative charges moves toward the common electrode 110 to implement black. Meanwhile, when the pixel voltage of positive potential is applied to the pixel electrode 109 and the common voltage of negative potential is applied to the common electrode 110, the white ink of positive charges moves toward the common electrode 110 and the black ink of negative charges moves toward the pixel electrode 109, implement white. The plurality of pixels are driven according to this principle, and as a result, an image is displayed on the electrophoretic panel.

The method for fabricating the electrophoretic display device according to an embodiment of the present invention will now be described with reference to FIGS. 4a to 4l.

Figure 4A:
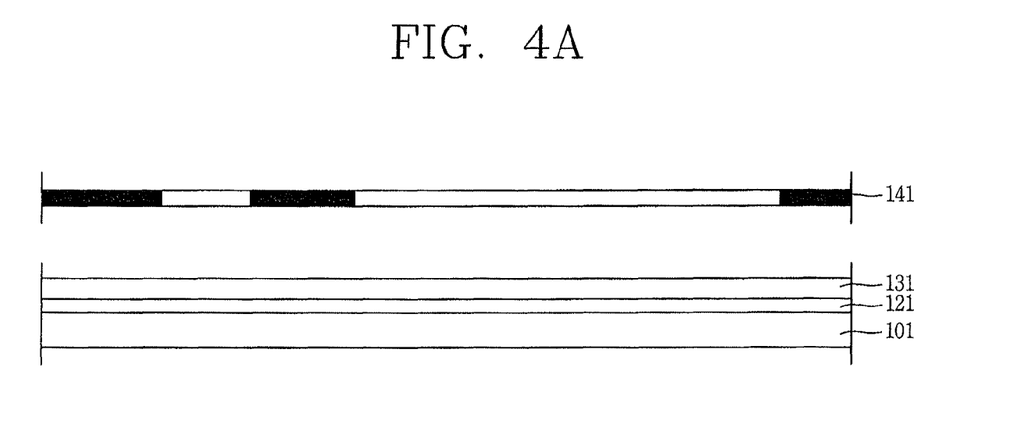
FIGS. 4a to 4l are sectional views showing the sequential steps of fabricating the electrophoretic display device of FIG. 2.

First, the first substrate 101 on which a plurality of pixels are defined and form the plurality of horizontal pixel rows and the plurality of vertical pixel rows is prepared.

Figure 4B:
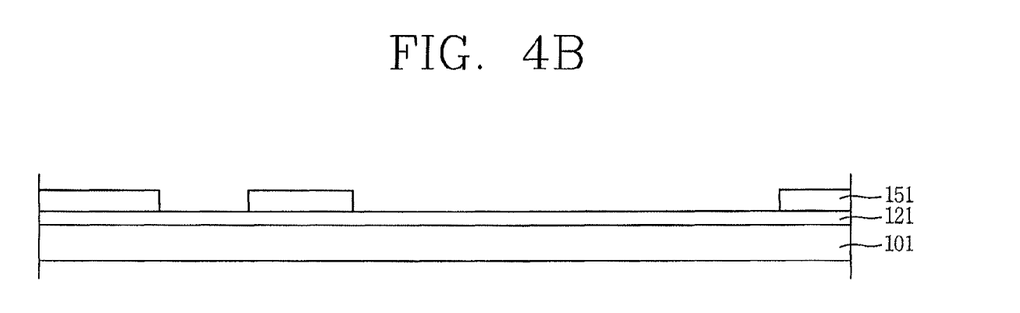

Next, as shown in FIG. 4a, a source/drain formation material layer 121 and a photosensitive film 131 are sequentially formed on the first substrate 101, on which photolithography is performed by using a first mask 141 including a blocking region and an exposing region to form a first photosensitive film pattern 151 as shown in FIG. 4b.

The first mask 141 includes the blocking region formed at the region corresponding to the source electrode 105a, the drain electrode 105b, and the data line 103 to be formed in a follow-up stage, and the exposing region formed at other regions than the blocking region. Here, the exposing region and the blocking region of the first mask 141 may be interchanged according to a type of the first photosensitive film 131.

Figure 4C:
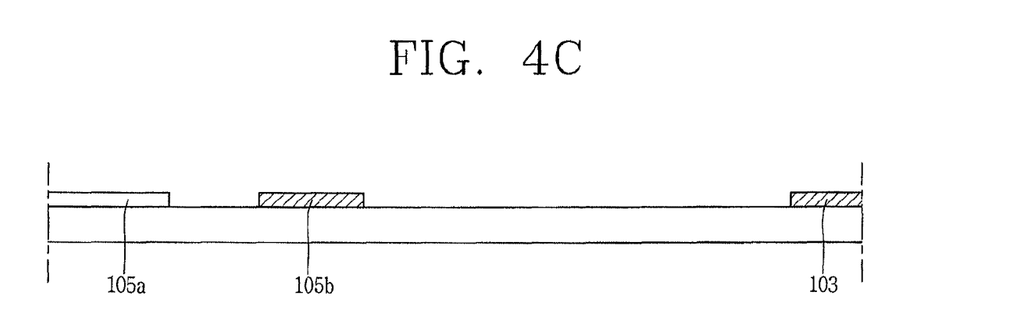

And then, the source/drain formation material layer 121 is selectively removed by using the first photosensitive film pattern 151 to form the source electrode 105a, the drain electrode 105b, and the data line 103 as shown in FIG. 4c, and then, the first photosensitive film pattern 151 is removed.

Figure 4D:
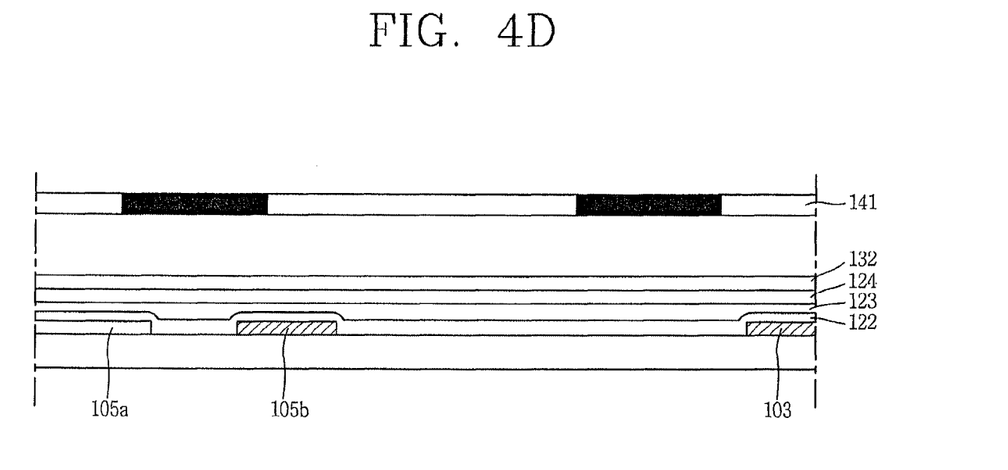
Figure 4E:
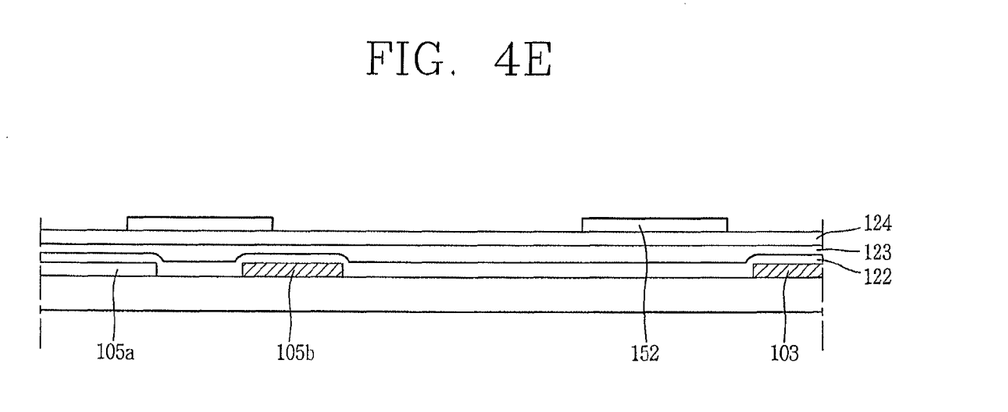

Thereafter, as shown in FIG. 4d, an organic semiconductor material layer 122, a gate insulating layer formation material layer 123, a gate formation material layer 124, and a second photosensitive film 132 are sequentially formed on the first substrate 101, on which photolithography is performed by using a second mask 142 including a blocking region and an exposing region to form a second photosensitive film pattern 152 as shown in FIG. 4e. Here, the organic semiconductor material layer 122 may be made of pentacene or polythiopene.

The second mask 142 includes the blocking region formed at the region corresponding to the organic semiconductor layer 105c, the gate insulating layer 150d, and the gate electrode 105e to be formed in a follow-up stage, and the exposing region formed at other regions than the blocking region. Here, the exposing region and the blocking region of the second mask 142 may be interchanged according to a type of the first photosensitive film 132.

Figure 4F:
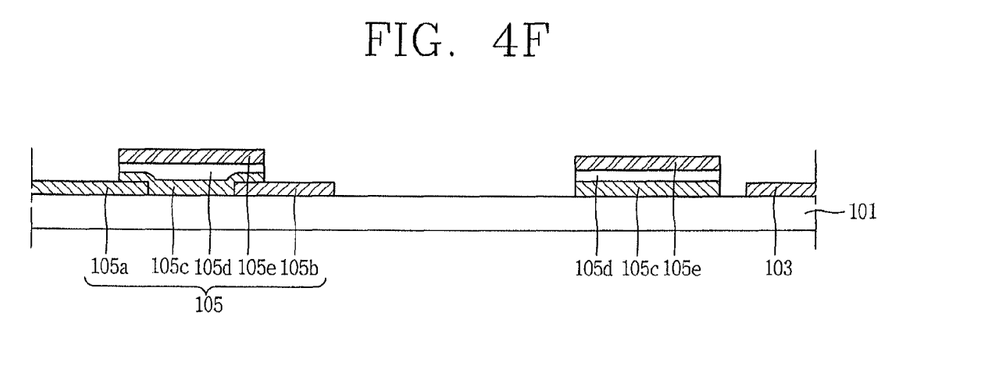

As shown in FIG. 4f, the gate formation material layer 124 is selectively removed by using the second photosensitive film pattern 152 to form the gate electrode 105e, the gate insulating layer formation material layer 123 is selectively removed by using the second photosensitive film pattern 152 to form the gate insulating layer 105d, and the organic semiconductor material layer 122 is selectively removed by using the second photosensitive film pattern 152 to form the organic semiconductor layer 105c, and then, the second photosensitive film pattern 152 is removed. At this time, the organic semiconductor layer 105c, the source electrode 105a and the drain electrode 105b are formed such that certain areas of them overlap with each other. The organic semiconductor layer 105c, the gate insulating layer 105d and the gate electrode 105e are formed to have the same area and have the same overlap area.

Figure 4G:
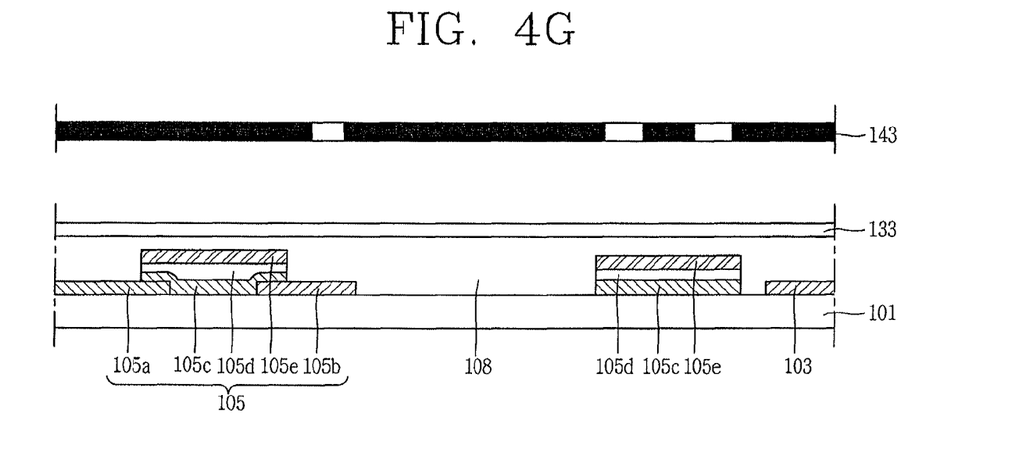
Figure 4H:
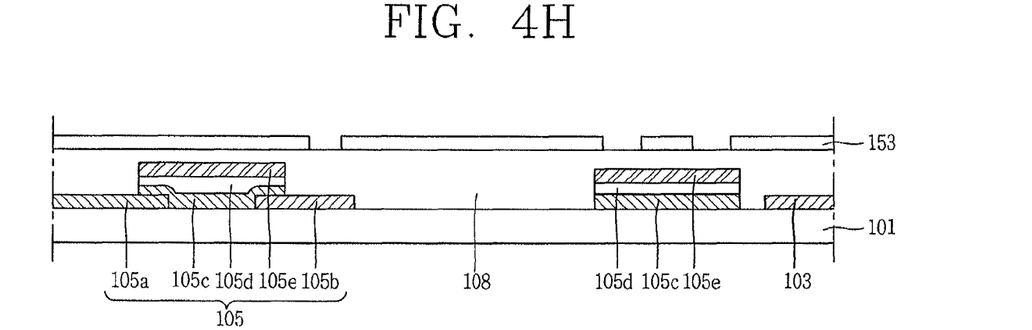

As shown in FIG. 4g, the passivation layer 108 and a third photosensitive film 133 are sequentially formed on the first substrate 101, on which photolithography is performed by using a third mask 143 including a blocking region and an exposing region to form a third photosensitive film pattern 153 as shown in FIG. 4h.

The third mask 143 includes the blocking region formed at the region corresponding to the first contact hole 106 and the second contact hole 107 to be formed in a follow-up stage, and the exposing region formed at other regions than the blocking region. Here, the exposing region and the blocking region of the third mask 143 may be interchanged according to a type of the third photosensitive film 133.

Figure 4I:
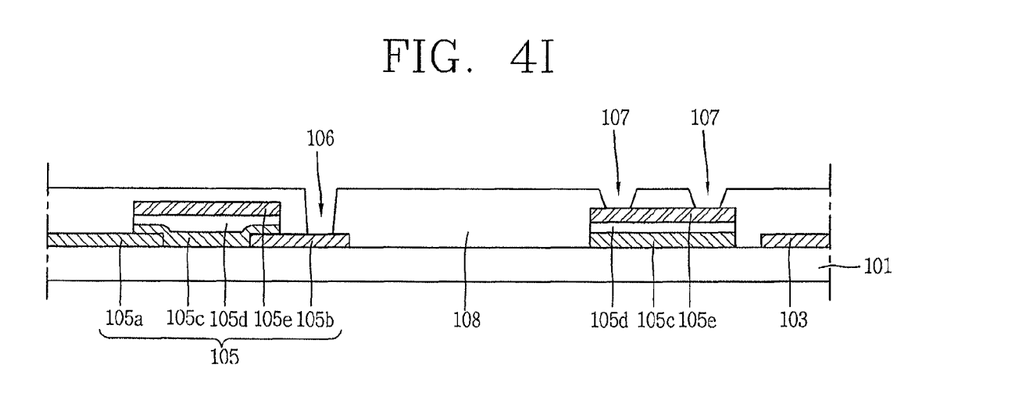

And then, as shown in FIG. 4i, the passivation layer 108 is selectively removed by using the third photosensitive film pattern 153 to form the first and second contact holes 106 and 107, and then, the third photosensitive film pattern 153 is removed.

Figure 4J:
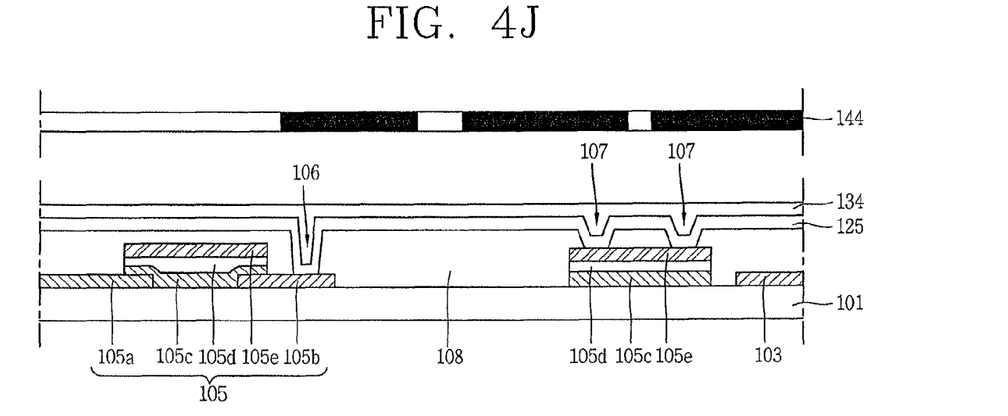
Figure 4K:
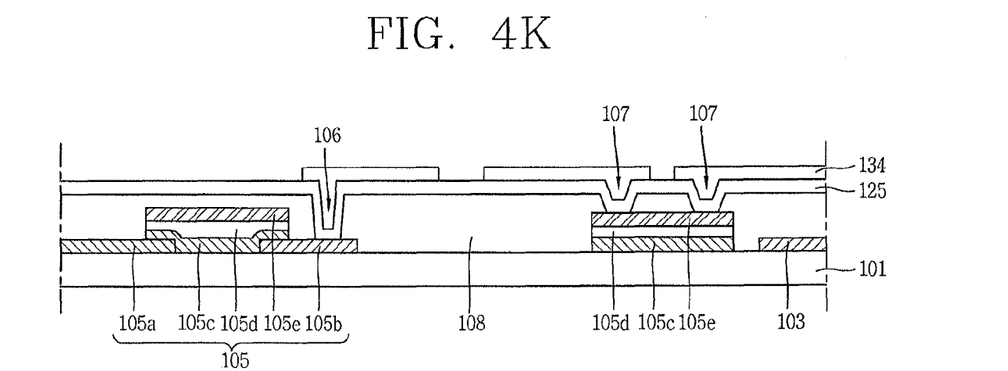

Thereafter, as shown in FIG. 4j, a conductive material layer 125 and a fourth photosensitive film 134 are sequentially formed on the first substrate 101, on which photolithography is performed by using a fourth mask including a blocking region and an exposing region to form a fourth photosensitive film pattern as shown in FIG. 4k. The conductive material layer 125 may be made of a transparent conductive material or an opaque metal. An example of the transparent conductive material may be ITO, and an example of the opaque metal may be molybdenum (Mo), aluminum (Al), chromium (Cr), copper (Cu), and the like.

The fourth mask 144 includes the blocking region formed at the region corresponding to the pixel electrode 109 and the gate line 104 to be formed in a follow-up stage, and the exposing region formed at other regions than the blocking region. Here, the exposing region and the blocking region of the fourth mask 144 may be interchanged according to a type of the fourth photosensitive film 134.

Figure 4L:
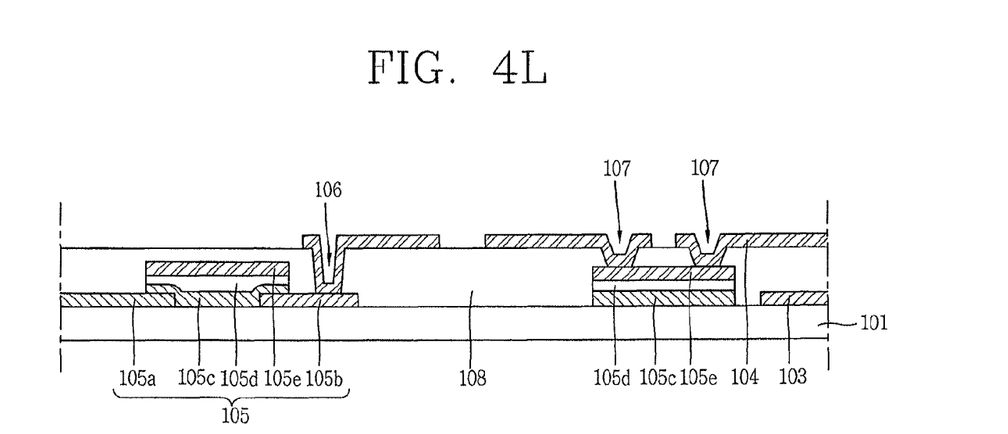

And then, the conductive material layer 125 is selectively removed by using the fourth photosensitive film pattern 154 to form the pixel electrode 109 and the gate line 104 as shown in FIG. 4l, and then, the fourth photosensitive film pattern 154 is removed.

Thereafter, the second substrate (102 in FIG. 3) with the common electrode (110 in FIG. 3) is prepared, and the electrophoretic film (not shown) is formed between the first and second substrates 101 and 102.

The electrophoretic display device according to the embodiments of the present invention as described above is advantageous in terms of costs and time because the number of masks sued for the fabrication process is minimized. In addition, in the electrophoretic display device, because the pixel electrode 109 is formed on the passivation layer 108, so close to the electrophoretic film, there is no need to form an open portion to expose the pixel electrode 109.

As for the electrophoretic display device according to the embodiments of the present invention, the first substrate 101 and the plurality of elements formed on the first substrate 101 may be applicable to a TFT array substrate of an LCD. In this case, because of the protection layer 108 with the minimized step, rubbing can be smoothly performed on the entire region of an alignment layer and a problem such as liquid crystal is not fully charged and the like does not arise. Here, the alignment layer of the LCD is a means for initially aligning a liquid crystal layer formed between the TFT array substrate and a color filter substrate of the LCD.

As the present invention may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

The invention claimed is:

1. An electrophoretic display device comprising:
   a first substrate having a plurality of pixels in a plurality of vertical pixel rows and a plurality of horizontal pixel rows;
   a plurality of data lines at every vertical pixel row of the first substrate;
   a thin film transistor (TFT) at each pixel of the first substrate and including a source electrode, a drain electrode, an organic semiconductor layer, and a gate electrode;
   a passivation layer on the TFTs and the data lines of the first substrate and including a first contact hole exposing the drain electrode of the TFT at each pixel and a pair of second contact holes exposing the gate electrode of the TFT at each pixel;
   a pixel electrode on the passivation layer at each pixel of the first substrate and connected with the drain electrode of the TFT via the first contact hole of the passivation layer;
   a plurality of gate lines on the passivation layer at every horizontal pixel row of the first substrate, the gate line for each horizontal pixel row including a plurality of opened gate lines opened above the gate electrodes such that the gate electrode at each pixel overlaps two adjacent ones of the opened gate lines, the pair of second contact holes being formed in the passivation layer at region where the two adjacent ones of the opened gate lines overlap the gate electrode so that the two adjacent ones of the opened gate lines are connected to the gate electrode through the pair of second contact holes, thereby the two adjacent ones of the opened gate lines disposed at the both sides of the gate electrode being electrically connected to each other;
   a second substrate attached to the first substrate in a facing manner;
   a common electrode formed on the second substrate; and
   an electrophoretic film between the first and second substrates.

2. The device of claim 1, wherein the organic semiconductor layer comprises one of pentacene or polythiopene.

3. The device of claim 1, wherein the TFT comprises source and drain electrodes on the first substrate, an organic semiconductor layer on the source and drain electrodes, a gate insulating layer on the organic semiconductor layer, and a gate electrode on the gate insulating layer, and the organic semiconductor layer, the gate insulating layer, and the gate electrode of the TFT have the same area and have the same overlap area.

4. The device of claim 1, wherein the pixel electrode and the gate line are made of the same material on the same layer.

5. The device of claim 1, wherein the pixel electrode and the gate line are made of a material selected from one of a transparent conductive material and an opaque metal.

6. The device of claim 1, wherein the pixel electrode and the gate line are made of a material selected from one of indium tin oxide (ITO), molybdenum (Mo), aluminum (Al), chromium (Cr), and copper (Cu).

* * * * *